United States Patent
Wu

(10) Patent No.: US 8,586,134 B2
(45) Date of Patent: Nov. 19, 2013

(54) METHOD OF FABRICATING HIGH-RESOLUTION FEATURES

(75) Inventor: Yiliang Wu, Oakville (CA)

(73) Assignee: Xerox Corporation, Norwalk, CT (US)

( * ) Notice: Subject to any disclaimer, the term of this patent is extended or adjusted under 35 U.S.C. 154(b) by 244 days.

(21) Appl. No.: 13/102,502

(22) Filed: May 6, 2011

(65) Prior Publication Data

US 2012/0279766 A1  Nov. 8, 2012

(51) Int. Cl.
  *B05D 5/12* (2006.01)
  *B05D 3/00* (2006.01)

(52) U.S. Cl.
  USPC ......... 427/98.4; 427/99.2; 427/123; 427/271; 427/277; 427/355

(58) Field of Classification Search
  USPC .............. 427/96.1, 98.4, 99.2, 123, 271, 277, 427/355
  See application file for complete search history.

(56) References Cited

U.S. PATENT DOCUMENTS

| | | |
|---|---|---|
| 6,107,117 A | 8/2000 | Bao et al. |
| 7,270,694 B2 * | 9/2007 | Li et al. ............ 75/351 |
| 2003/0136958 A1 | 7/2003 | Ong et al. |
| 2003/0160230 A1 | 8/2003 | Ong et al. |
| 2006/0160234 A1 | 7/2006 | Lopez-Avila et al. |
| 2006/0189113 A1 * | 8/2006 | Vanheusden et al. ......... 438/597 |
| 2006/0252163 A1 * | 11/2006 | Yaniv et al. .................. 438/20 |
| 2006/0292297 A1 * | 12/2006 | Mao et al. .................... 427/180 |
| 2007/0099357 A1 | 5/2007 | Li et al. |
| 2009/0148600 A1 | 6/2009 | Li et al. |
| 2009/0181183 A1 | 7/2009 | Li et al. |
| 2009/0274834 A1 | 11/2009 | Chopra et al. |
| 2009/0301344 A1 | 12/2009 | Chretien et al. |

OTHER PUBLICATIONS

U.S. Appl. No. 12/331,573, filed Dec. 10, 2008.

* cited by examiner

*Primary Examiner* — Brian K Talbot
(74) *Attorney, Agent, or Firm* — Oliff & Berridge, PLC

(57) ABSTRACT

A method of forming a high resolution feature on a substrate, the method includes, depositing a liquid composition comprising a substance and a solvent onto the substrate to form deposited features, heating the deposited features to a heating temperature during or after the depositing to form an intermediate feature having a central region and an edge region, applying an adhesive substance to at least a portion of a surface of the intermediate feature, and removing the adhesive substance together with at least a portion of the central region of the intermediate feature to form the high resolution feature on the substrate.

17 Claims, 1 Drawing Sheet

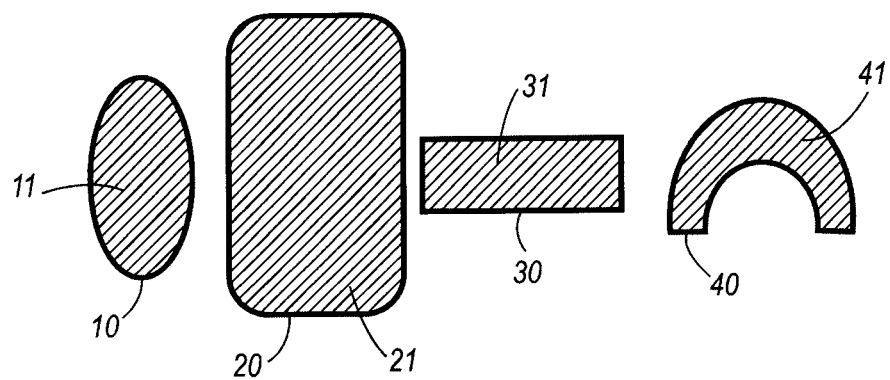

METHOD OF FABRICATING HIGH-RESOLUTION FEATURES

BACKGROUND

Fabrication of electronic circuit elements using liquid deposition techniques is of profound interest as such techniques provide potentially low-cost alternatives to conventional mainstream amorphous silicon technologies for electronic applications such as thin film transistors (TFTs), light-emitting diodes (LEDs), RFID tags, photovoltaics, and the like.

Solution-processable conductors are of great interest for use in such electronic applications. Metal nanoparticle-based inks represent a promising class of materials for printed electronics. However, most conventional printing methods such as inkjet printing, screen printing and flexography printing cannot offer very high-resolution features. For example, screen printing normally results in line having a width of 100 microns, while inkjet printing with a 10 pL nozzle usually forms a line having a width no less than 30 microns. Although special inkjet printers may be designed to print very small droplets, it is very difficult to achieve reliable and consistent printing results, particularly using particle-based ink, since the nozzle trends clog. Although conventional photolithography method can produce high-resolution lines, such as 1 to 5 microns, this method is too costly for low-cost electronic fabrication.

While currently available methods for preparing conductive elements for electronic devices are suitable for their intended purposes, to achieve high-resolution devices, there remains a need for a low-cost method suitable for preparing conductive structures using stable metal ink compositions, the conductive features having a width of less than 10 microns which is comparable with conventional lithographic method.

SUMMARY

There is therefore a need, addressed by the subject matter disclosed herein, for a method of forming conductive features, such as metal electrodes or interconnects, having a width of less than 10 microns, using a liquid deposition method for low-cost fabrication on a material such as a plastic substrate.

The above and other issues are addressed by the present application, wherein in embodiments a method of forming a high resolution feature on a substrate, the method comprising: depositing a liquid composition comprising a substance and a solvent onto the substrate to form deposited features, heating the deposited features to a heating temperature during or after the depositing to form an intermediate feature having a central region and an edge region, applying an adhesive substance to at least a portion of a surface of the intermediate feature, and removing the adhesive substance together with at least a portion of the central region of the intermediate feature to form the high resolution feature on the substrate. In specific embodiments, the substance may be a metal nanoparticle, and the depositing performed by inkjet printing. In further embodiments, the intermediate feature comprises a residual amount of the solvent at the central region.

In embodiments, described is a composition comprising a metal nanoparticle, a stabilizer, a first solvent and a second solvent, wherein the first solvent has a boiling point of at least 50° C. higher than a boiling point of the second solvent, and at least 100° C. higher than the minimum sintering temperature of the metal nanoparticles. In specific embodiments, a majority of the stabilizer molecules may be associated with the metal nanoparticle surface, and a minority of the stabilizer molecules may be dissociated as free stabilizers in the composition.

In embodiments, described is a conductive feature on a substrate having a line width less than about 10 microns, wherein the feature is formed by: depositing a liquid composition comprising a metal nanoparticle, a stabilizer, and a solvent onto the substrate to form a patterned deposited feature, heating the deposited feature to a heating temperature during or after the depositing to form an intermediate feature having a central region and an edge region, applying an adhesive substance to at least a portion of a surface of the intermediate feature, and removing the adhesive substance together with at least a portion of the central region of the intermediate feature to form the conductive feature on the substrate.

BRIEF DESCRIPTION OF THE DRAWINGS

Illustrated in FIG. 1 is edge regions and central regions of the intermediate feature.

EMBODIMENTS

The present process is a method of forming a high-resolution feature on a substrate. The method comprises depositing a substance and a liquid media onto the substrate to form a deposited feature. In embodiments, the substance is a metal nanoparticle. The deposited feature is heated during or after the depositing to form an intermediate feature having a central region and an edge region. An adhesive substance is then applied to at least a portion of a surface of the intermediate feature, which upon removal of the adhesive substance along with at least a portion of the central region of the intermediate feature, forms the high resolution feature on the substrate.

As used herein, the phrase "high resolution feature" is defined as a feature having a width less than 30 microns, including less than 10 microns, or less than 5 microns, such as, for example, from about 0.1 to about 10 microns, or from about 0.5 to about 5 microns. Generally, a line with such small line width cannot be produced by conventional printing methods such as screen, gravure, flexography and inkjet printing. In some embodiments, the high-resolution feature has a unique cross-section profile that is unsymmetrical, since the two edges of the high-resolution feature are formed in different steps. One edge of the high-resolution feature is defined by the deposition step, namely the edge of the intermediate feature, while the other edge of the high-resolution feature is formed by the removal of the central region of the intermediate feature with the adhesive substance. Since the two edges are formed by two different methods; therefore, they may have different profiles. This is different from conventional high-resolution features prepared by photolithographic method, wherein the two edges of the high-resolution features are formed simultaneously with the same process, and thus exhibit a similar profile. Furthermore, forming a high-resolution feature with an unsymmetrical profile does have some advantages, such as, for example, providing an unsymmetrical injection of charges in electronic devices.

Substance

The liquid composition herein includes the substance and a liquid media. In some embodiments, the substance may be a metal nanoparticle. In other embodiments, the substance may be a conductive polymer such as PEDOT/PSS, polyaniline; an insulating polymer such as polyacrylate, polysiloxane, polyurethane, polyimide, and the like; a semiconducting polymer such as polythiophene; or a metal oxide nanoparticle such as $TiO_2$, $Al_2O_3$, $ZrO_2$, ZnO, and the like. When metal nanoparticles or conductive polymers are used, the invented method can be used to make very fine (high resolution) conductive lines for electronic device applications. When insulating polymers are used, the above method can be used to make, for example, fine insulating edge or bank to confine subsequently deposited materials for applications such as to pattern the pixel of liquid crystal and printed LED. If the substance is a metal nanoparticle, the liquid composition may be referred to as a metal ink composition.

The term "nano" as used in "metal nanoparticles" or "metal nanoparticle composition" refers to, for example, a particle size of less than about 1,000 nm, such as, for example, from about 0.5 nm to about 1,000 nm, for example, from about 1 nm to about 500 nm, from about 1 nm to about 100 nm, from about 1 nm to about 25 nm or from about 1 to about 10 nm. The particle size refers to the average diameter of the metal particles, as determined by TEM (transmission electron microscopy) or other suitable method. Generally, a plurality of particle sizes may exist in the metal nanoparticles obtained from the process described herein. In embodiments, the existence of different sized silver-containing nanoparticles is acceptable.

In embodiments, the metal nanoparticles are composed of (i) one or more metals or (ii) one or more metal composites. Suitable metals may include, for example, Al, Ag, Au, Pt, Pd, Cu, Zn, Sn, In, Co, Cr, In, and Ni, particularly the transition metals, for example, Ag, Au, Pt, Pd, Cu, Cr, Ni, and mixtures thereof. Silver may be used as a suitable metal. Suitable metal composites may include Au—Ag, Ag—Cu, Ag—Ni, Au—Cu, Ag—Pd, Au—Ni, Au—Ag—Cu, and Au—Ag—Pd. The metal composites may also include non-metals, such as, for example, Si, C, and Ge. The various components of the metal composite may be present in an amount ranging, for example, from about 0.01% to about 99.9% by weight, particularly from about 10% to about 90% by weight.

The metal composite is a metal alloy composed of silver and one, two or more other metals, with silver comprising, for example, at least about 20% of the nanoparticles by weight, particularly greater than about 50% of the nanoparticles by weight.

The metal ink composition has a viscosity at least 2 cps, including from about 2 cps to about 5000 cps, from about 5 cps to about 2000 cps, as measured by a rheology meter at room temperature at a low shear rate of, for example, 1 $s^{-1}$. In a specific embodiment, the metal ink composition has a low viscosity suitable for inkjet printing, such as, for example, from about 2 cps to about 30 cps.

Unless otherwise noted, the weight percentages recited herein for the components in the metal ink composition do not include the stabilizer.

The metal nanoparticles may be a mixture of two or more bimetallic metal nanoparticle species, such as those described in commonly assigned U.S. Patent Application Pub. No. 2009/0274834, which is incorporated herein by reference in its entirety, or a bimodal metal nanoparticle, such as those described in U.S. Patent Application Publication No. 2009/0301344, which is also incorporated herein by reference in its entirety.

If the metal nanoparticle is silver, the silver nanoparticles have a stability (that is, the time period where there is minimal precipitation or aggregation of the silver-containing nanoparticles) of, for example, at least about 1 day, or from about 3 days to about 1 week, from about 5 days to about 1 month, from about 1 week to about 6 months, from about 1 week to over 1 year.

The weight percentage of the metal nanoparticles (excluding the stabilizer) in the metal ink composition is from about 10 weight percent to about 90 weight percent, for example, from about 20 weight percent to about 80 weight percent or from about 30 weight percent to about 70 weight percent.

Stabilizer

The liquid composition described herein may also contain a stabilizer such as an organic stabilizer that is connected to the surface of the metal nanoparticles and is not removed until the annealing of the metal nanoparticles during formation of intermediate feature on a substrate.

In embodiments, the stabilizer is physically or chemically associated with the surface of the metal nanoparticles. In this way, the nanoparticles have the stabilizer thereon outside of a liquid solution. That is, the nanoparticles with the stabilizer thereon may be isolated and recovered from a reaction mixture solution used in forming the nanoparticles and stabilizer complex. The stabilized nanoparticles may thus be subsequently readily and homogeneously dispersed in a solvent for forming the liquid composition.

As used herein, the phrase "physically or chemically associated" between the metal nanoparticles and the stabilizer may be a chemical bond and/or other physical attachment. The chemical bond can take the form of, for example, covalent bonding, hydrogen bonding, coordination complex bonding, or ionic bonding, or a mixture of different chemical bonds. The physical attachment can take the form of, for example, van der Waals' forces or dipole-dipole interaction, or a mixture of different physical attachments.

When dissolved or dispersed in the solvent, the stabilizer may dissociate from the metal nanoparticle surface and be dissolved in the solvent as free stabilizer. There will be equilibrium between the associate stabilizer molecule and the free stabilizer molecule. In embodiments, a majority of stabilizer is associated on the surface of the metal nanoparticles in an amount of at least 60% by weight, such as, for example from about 60 to about 99.9 percent, including from about 80 to about 99.5%, or from about 90 to about 98% by weight. However, a minority of stabilizer is free stabilizer in the liquid composition, such as, for example, from about 0.1 to about 40%, from about 0.5 to about 20%, or from about 2 to about 10%, by weight. The free stabilizer, as further illustrated thereafter, may help to reduce the adhesion between the intermediate feature and the substrate, since the stabilizer contains a hydrocarbon chain. As a result, the small amount of free stabilizer will help to remove the majority central region of the intermediate feature.

The term "organic" in the phrase "organic stabilizer" or "organic-stabilized" refers to, for example, the presence of carbon atom(s), but the organic stabilizer may include one or more non-metal heteroatoms such as nitrogen, oxygen, sulfur, silicon, halogen, and the like. The organic stabilizer may be an organoamine stabilizer such as those described in U.S. Pat. No. 7,270,694, which is incorporated by reference herein in its entirety. Examples of the organoamine are an alkylamine, such as for example butylamine, pentylamine, hexylamine, heptylamine, octylamine, nonylamine, decylamine, hexadecylamine, undecylamine, dodecylamine, tridecylamine, tetradecylamine, diaminopentane, diaminohexane, diaminoheptane, diaminooctane, diaminononane, diaminodecane, diaminooctane, dipropylamine, dibutylamine, dipentylamine, dihexylamine, diheptylamine, dioctylamine, dinonylamine, didecylamine, methylpropylamine, ethylpropylamine, propylbutylamine, ethylbutylamine, ethylpentylamine, propylpentylamine, butylpentylamine, tributylamine, trihexylamine, and the like, or mixtures thereof.

Examples of other organic stabilizers include, for example, those having a formula of X—Y, wherein X is a hydrocarbon group comprising from about 4 to about 24 carbon atoms, from about 6 to about 18 carbon atoms, from about 8 to about 14 carbon atoms and from about 10 to about 14 carbon atoms, and wherein Y is a functional group attached to a surface of the metal nanoparticle and being selected from the group consisting of hydroxyl, amine, carboxylic acid, thiol and its derivatives, xanthic acid, pyridine, pyrrolidone, carbamate and mixtures thereof.

Examples of other organic stabilizers include, for example, thiol and its derivatives, —OC(=S)SH (xanthic acid), polyethylene glycols, polyvinylpyridine, polyvinylpyrrolidone, and other organic surfactants. The organic stabilizer may be selected from the group consisting of a thiol such as, for example, butanethiol, pentanethiol, hexanethiol, heptanethiol, octanethiol, decanethiol, and dodecanethiol; a dithiol such as, for example, 1,2-ethanedithiol, 1,3-propanedithiol, and 1,4-butanedithiol; or a mixture of a thiol and a dithiol. The organic stabilizer may be selected from the group consisting of a xanthic acid such as, for example, O-methylxanthate, O-ethylxanthate, O-propylxanthic acid, O-butylxanthic acid, O-pentylxanthic acid, O-hexylxanthic acid, O-heptylxanthic acid, O-octylxanthic acid, O-nonylxanthic acid, O-decylxanthic acid, O-undecylxanthic acid, O-dodecylxanthic acid. Organic stabilizers containing a pyridine derivative (for example, dodecyl pyridine) and/or organophosphine that can stabilize metal nanoparticles may also be used as the stabilizer herein.

Further examples of organic stabilized metal nanoparticles may include: the carboxylic acid-organoamine complex stabilized metal nanoparticles described in U.S. Patent Application Pub. No. 2009/0148600; the carboxylic acid stabilizer metal nanoparticles described in U.S. Patent Application Pub. No. 2007/0099357 A1, and the thermally removable stabilizer and the UV decomposable stabilizers described in U.S. Patent Application Pub. No. 2009/0181183, each of which is incorporated by reference herein in their entirety.

The extent of the coverage of stabilizer on the surface of the metal nanoparticles can vary, for example, from partial to full coverage depending on the capability of the stabilizer to stabilize the metal nanoparticles. Of course, there is variability as well in the extent of coverage of the stabilizer among the individual metal nanoparticles.

The weight percentage of the optional stabilizer in the metal ink composition may be from, for example, about 1 weight percent to about 50 weight percent, from about 5 weight percent to about 40 weight percent or from about 10 weight percent to about 30 weight percent.

Solvent

In embodiments, the liquid composition includes at least one solvent. The solvent has a boiling point that is at least 100° C., such as, for example, at least about 100° C. to about 300° C., at least about 150° C. to about 250° C. and at least about 175° C. to about 200° C., higher than the heating temperature of the substance or the minimum sintering temperature of the metal nanoparticles. The minimum sintering temperature of the metal nanoparticles can be determined by various methods for example, TGA, or DSC scan. The onset decomposition temperature in TGA, or the onset phase transition temperature (melting of metal nanoparticles) can be defined as the minimum sintering temperature. Specific examples of the solvent include dodecylbenzene; decalin; tetrahydronaphthalene; bi-cyclohexane; isoparaffinic hydrocarbons; hexalin; a cyclic terpene including monocyclic monoterpenes such as limonene and selinene along with bicyclic monoterpene, a cyclic terpinene such as cyclodecene, 1-Phenyl-1-cyclohexene; 1-tert-Butyl-1-cyclohexene; Terpinolene; γ-Terpinene; α-Terpinene; α-Pinene; terpineol; methyl naphthalene, and mixtures thereof.

The liquid composition may be produced by dispersing or dissolving the substance in the solvent. Various techniques can be used to facilitate or accelerate the dispersing or dissolving the substance, for example, sonicating, stirring, heating, homogenizing, and the like.

In embodiments, the liquid composition may include additional solvents. If additional solvents are present in the liquid composition, the solvent having a boiling point that is at least 100° C. higher than the heating temperature may be also referred to herein as the "first solvent." If an additional solvent is present in the liquid composition, the additional solvent may be referred to herein as the "second solvent." The first solvent is the solvent that allows at least a portion of the printed conducted feature, such as the central portion, or the entirety of printed conductive feature to be removed after annealing. The second solvent desirably facilitates the dispersion of the unstabilized or stabilized metal nanoparticles. The first solvent, in addition to the second solvent, may also contribute to the dispersion of the unstabilized or stabilized metal nanoparticles. If a second solvent is present in the liquid composition, the first solvent has a boiling point of at least 50° C., such as from about 50° C. to about 150° C., from about 50° C. to about 100° C. and from about 50° C. to about 75° C., higher than the boiling point of the second solvent.

Examples of the second solvent may include, for example, an alkane or an alcohol having from about 10 to about 18 carbon atoms or from about 10 to about 14 carbon atoms, such as, undecane, dodecane, tridecane, tetradecane, 1-undecanol, 2-undecanol, 3-undecanol, 4-undecanol, 5-undecanol, 6-undecanol, 1-dodecanol, 2-dodecanol, 3-dodecanol, 4-dodecanol, 5-dodecanol, 6-dodecanol, 1-tridecanol, 2-tridecanol, 3-tridecanol, 4-tridecanol, 5-tridecanol, 6-tridecanol, 7-tridecanol, 1-tetradecanol, 2-tetradecanol, 3-tetradecanol, 4-tetradecanol, 5-tetradecanol, 6-tetradecanol, 7-tetradecanol, and the like; a monoterpene alcohol, such as for example, terpineol (α-terpineol), β-terpineol, geraniol, cineol, cedral, linalool, 4-terpineol, lavandulol, citronellol, nerol, methol, borneol, and the like; isoparaffinc hydrocarbons, such as, for example, isodecane, isododecane, and commercially available mixtures of isoparaffins such as ISOPAR E, ISOPAR G, ISOPAR H, ISOPAR L and ISOPAR M (all the above-mentioned manufactured by Exxon Chemical Company), SHELLSOL (made by Shell Chemical Company), SOLTROL (made by Philips Oil Co., Ltd.), BEGASOL (made by Mobil Petroleum Co., Inc.) and IP Solvent 2835 (made by Idemitsu Petrochemical Co., Ltd.); toluene; decalin; xylene; mesistylene, diethylbenzene, trimethylbenzene and tetralin and mixtures thereof. Further examples of second solvents include the dispersing solvents disclosed in U.S. patent application Ser. No. 12/331,573, which is incorporated by reference herein in its entirety. It should be noted that the second solvent and the first solvent can be chosen from the similar chemical group as long as they meet the requirement that the first solvent has a boiling point of at least 50° C. higher than the boiling point of the second solvent, and at least 100° C. higher than the minimum sintering temperature of the metal nanoparticles.

If no second solvent is used, the first solvent may be present in the liquid composition in an amount of at least 1 weight percent of the composition, such as for example from about 1 weight percent to about 90 weight percent, from about 5 weight percent to about 80 weight percent, from about 10 weight percent to about 70 weight percent and from about 20 weight percent to about 60 weight percent of the composition.

If at least two solvents are used, the first solvent may be present in the liquid composition in an amount of at least 1 weight percent of the composition, such as for example from about 1 weight percent to about 20 weight percent, from about 2 weight percent to about 15 weight percent, from about 2 weight percent to about 10 weight percent and from about 3 weight percent to about 5 weight percent of the composition. The second solvent may be present in the liquid composition in an amount of at least 10 weight percent of the composition, such as for example from about 10 weight percent to about 70 weight percent, from about 30 weight percent to about 60 weight percent, from about 30 weight percent to about 55 weight percent and from about 40 weight percent to about 50 weight percent of the composition.

Deposition

The fabrication of the deposited features from the liquid composition can be carried out by depositing the liquid composition on a substrate using a liquid deposition technique at any suitable time prior to or subsequent to the formation of other optional layer or layers on the substrate. Thus, liquid deposition of the composition on the substrate can occur either on a substrate or on a substrate already containing layered material, for example, a semiconductor layer and/or an insulating layer.

The phrase "liquid deposition technique" refers to, for example, deposition of liquid composition using a liquid process such as liquid coating or printing, where the liquid is a homogeneous or heterogeneous dispersion of the substance. As discussed above, the liquid composition may be referred to as an ink when printing is used to deposit the liquid composition. Examples of liquid coating processes may include, for example, spin coating, blade coating, rod coating, dip coating, and the like. Examples of printing techniques may include, for example, lithography or offset printing, gravure, flexography, screen printing, stencil printing, inkjet printing, stamping (such as microcontact printing), and the like. Liquid deposition deposits a layer of the composition having a thickness ranging from about 5 nanometers to about 5 millimeters, such as from about from about 10 nanometers to about 1000 micrometers. Furthermore, as shown in FIG. 1, the deposited features may take the form of any two-dimensional or three-dimensional geometric shape, such as, for example, a circle or dot, a square, a straight or curved line. The deposited metal nanoparticle composition at this stage may or may not exhibit appreciable electrical conductivity. In some specific embodiments, the depositing is printing, and the deposited feature is a patterned feature. The depositing step defines the position of the high-resolution feature on the substrate, by defining the first edge of the high-resolution feature, which is the edge of the deposited feature.

The substrate may be composed of, for example, silicon, glass plate, plastic film or sheet. For structurally flexible devices, plastic substrate, such as, for example, polyester, polycarbonate, polyimide sheets and the like may be used. The thickness of the substrate may be from amount 10 micrometers to about 10 millimeters, from about 50 micrometers to about 2 millimeters, especially for a flexible plastic substrate and from about 0.4 millimeters to about 10 millimeters for a rigid substrate such as glass or silicon.

Annealing

The liquid composition may be heated during or after the deposition of the liquid composition onto the substrate to form the intermediate feature. If the liquid composition is a metal ink composition, the heating induces the metal nanoparticles to "anneal" and thus forms electrically conductive portions on the substrate, such as an electrically conductive intermediate feature. In one embodiment, the liquid composition is heated during the deposition step or after the deposition step. The electrically conductive layer is suitable as an electrically conductive element in electronic devices. For substrates, such as glass, that do not require a low annealing temperature, the deposited liquid composition may be heated to a temperature of 100° C. or higher, such as from about 100° C. to about 350° C., from about 100° C. to about 250° C. and from about 100° C. to about 200° C. However, for other substrates, such as low cost substrates that favor an annealing temperature less than about 200° C., the deposited liquid composition may be heated to a temperature of, for example, at or below about 200° C., such as, for example, from about 80° C. to about 200° C., from about 100° C. to about 180° C. and from about 100° C. to about 160° C. Regardless of the substrate used, the heating temperature is desirably one that does not cause adverse changes in the properties of any previously deposited layer(s) or the substrate (whether single layer substrate or multilayer substrate). When the liquid composition is heated, the choice of the substance is important so that a low heating temperature of from about 100° C. to about 150° C. could be used. In embodiments, the organic-stabilized metal nanoparticles are capable of annealing at the low temperature from about 100° C. to about 200° C. to form highly conductive features.

The heating is performed for an amount of time such that the solvent, if present, is substantially or entirely removed from the substrate. Portions of the first solvent may also be substantially removed during the heating. For example, as used herein, the phrase "substantially removed" is defined as the removal of at least 95%, at least 98% or at least 99% of the solvent(s). For example, the amount of time may range from, for example, 0.01 second to about 10 hours and from about 10 seconds to 1 hour. The heating can be performed in air, in an inert atmosphere, for example, under nitrogen or argon, or in a reducing atmosphere, for example, under nitrogen containing from 1 to about 20 percent by volume hydrogen. The heating can also be performed under normal atmospheric pressure or at a reduced pressure of, for example, from about 1000 mbars to about 0.01 mbars.

As used herein, the term "heating" encompasses any technique(s) that can impart sufficient energy to form the intermediate feature on the substrate, such for example, if the substance is a metal nanoparticle, to (1) anneal the metal nanoparticles and/or (2) remove the optional stabilizer from the metal nanoparticles. Examples of heating techniques may include thermal heating (for example, a hot plate, an oven, and a burner), infra-red ("IR") radiation, a laser beam, flash light, microwave radiation, or UV radiation, or a combination thereof.

Heating produces a number of effects. For example, the inclusion of the solvent, such as dodecylbenzene, having a boiling point that is at least 100° C. higher than the heating temperature of the liquid composition, likely results in at least a residual amount (for example from about 0.001% to about 1%, including from about 0.01% to about 0.1%, by weight) of the solvent accumulating and/or remaining in a region, such as the central region, of the intermediate feature. Upon heating, the solvent may recede to the central region of the deposited feature. The accumulated or remaining amount of the solvent may reduce the adhesion and/or cohesion of intermediate feature, such that at least a majority of the central region of the intermediate feature contacting the adhesive substance (along with the adhesive substance) may be removed. The "majority" of the central region that is removed may be greater than 80%, greater than 90%, greater than 95% or greater than 99% of the original area of the deposited feature. The remaining conductive features are the edge portions of the intermediate feature prior to the removal of the central portion of the conductive feature, which may have a width of less than 10 microns, such as, for example, from about 1 micron to about 10 microns, from about 2 microns to about 5 microns and from about 3 microns to about 4 microns. As shown in FIG. 1, the intermediate feature may include an edge region 10, 20, 30, 40 and a central region 11, 21, 31, 41. This removal may result in two high-resolution features on the substrate that may be identically parallel or substantially parallel to one another, and consistently spaced apart from one another.

Furthermore, prior to heating, the layer of the deposited feature may be electrically insulating or with very low electrical conductivity, but heating results in an electrically conductive layer composed of annealed metal nanoparticles, which increases the conductivity. In embodiments, the annealed metal nanoparticles may be coalesced or partially coalesced metal nanoparticle. It may be possible that in the annealed metal nanoparticles, the metal nanoparticles achieve sufficient particle-to-particle contact to form the electrically conductive layer without coalescence.

In embodiments, after heating and before removal of the adhesive substance, the resulting intermediate feature, such as an electrically conductive line, may have a height or a thickness of at least 10 nanometers, for example, 10 nanometers to about 1 mm, from about 50 nanometers to about 500 µm, from about 50 nanometers to about 250 µm, from about 50 nanometers to about 100 µm and from about 100 nanometers to about 50 µm. Furthermore, after heating, the intermediate feature may have a width of at least 30 microns, for example, 30 µm to about 10 mm, from about 50 µm to about 1 mm, from about 75 µm to about 250 µm, from about 100 µm to about 200 µm and from about 100 µm to about 150 µm.

The conductivity of the single conductive feature produced by heating the deposited metal composition is, for example, more than about 100 Siemens/centimeter ("S/cm"), more than about 1000 S/cm, more than about 2,000 S/cm, more than about 5,000 S/cm, or more than about 10,000 S/cm or more than 50,000 S/cm.

Heating may also result in the dissociation and evaporation of the stabilizer that is present on the surface of the metal nanoparticles. It is believed that heating will remove a majority of the stabilizers, such as, for example, from about 80 to about 99.9%, from about 90 to about 99.5%, or from about 95 to about 99%, by weight. However, it is believed that there may be a minority of the stabilizer(s), or its decomposed form, present on the surface of the annealed or sintered metal nanoparticles, such as, for example, from about 0.1 to about 20%, from about 0.5 to about 10% or from about 1 to about 5% by weight. Since the stabilizer may comprise a long hydrocarbon chain, it will provide a low polarity surface, thus a poor adhesion to the substrate.

Adhesive Substance

An adhesive substance may be applied, either directly or indirectly, to at least a portion of a surface of the intermediate feature. The adhesive substance may also be applied so as to entirely cover the entire surface of the intermediate feature. The adhesive substance should have a level of adhesive strength, such as from about 0.5 to about 15 N/mm, including from about 0.5 to about 10 N/mm, or from about 0.75 to about 5 N/mm, that is greater than the adhesive strength of the portion being removed from the conductive feature of the substrate. However, the high-resolution feature (remaining on the substrate after removal of the adhesive substance, which may be the edge regions of the intermediate feature) should have an adhesive strength that is greater than the adhesive strength of the adhesive substance to the surface of the central region or portion of the intermediate feature. The residual amount of solvent, or the residual amount of stabilizer may induce a lower adhesion strength to the substrate at the central region than the adhesion strength at the edge region. The difference may be, for example, from about 0.1 to about 5 N/mm, from about 0.2 to about 1 N/mm, or from about 0.5 to about 1.0 N/mm. Examples of the adhesive substance include an adhesive tape comprised of a backing material coated with an adhesive substance, such as SCOTCH tape (manufactured by 3M Innovative Properties Company) pressure sensitive adhesives based on acrylate polymers, polychloroprene, hot melt adhesives such as terpene resin, ethylene-vinyl acetate, or so called thermoplastic glue, some reactive adhesive substance such as polyester resin/polyurethane resin, polyols/polyurethane resin, acrylic polymer/polyurethane resins, natural adhesives such as natural rubbers, vegetable matter, starch, and the like, synthetic rubbers such as butyl rubbers, silicon rubbers, epoxy rubbers, styrene-butadiene-styrene rubbers. In some embodiments, the adhesive coated on a supporting substrate before applied on the surface of the intermediate feature. Also, in some embodiments, the adhesive is a removable adhesive such as pressure sensitive adhesive, the rubbers, and the like.

The adhesive substance, after application to the surface of the intermediate feature, is removed from a portion of the intermediate feature to form at least the high-resolution feature on the substrate. For example, if the adhesive substance is an adhesive tape, the adhesive tape is removed by pulling the adhesive tape with a sufficient amount of force to remove at least the central portion of the intermediate feature from the substrate. At this point and as discussed above, the intermediate feature contains a residual or trace amount of the solvent such that a central region of the intermediate feature containing the solvent is weakly adhered to the substrate and can be removed. The portion removed from the printed conductive substrate may be a located in a central portion of the intermediate feature, and may have a variable size depending on the size of the intermediate feature. The width of the removed portion corresponds to the distance between the inner edges of the at least two conductive features. Furthermore, after removal, the high resolution feature (or conductive feature if the composition contains metal nanoparticles) may be any suitable two-dimensional or three dimensional geometric shape, such as a loop, two parallel lines, and a circle, each having a width of less than about 10 microns, such as, for example, from about 0.1 µm to about 10 µm, from about 1 µm to about 10 µm, from about 1 µm to about 5 µm and from about 2 µm to about 5 µm.

The resulting high-resolution feature(s) can be used as electrodes, conductive pads, interconnects, conductive lines, conductive tracks, and the like in electronic devices such as thin film transistors, organic light emitting diodes, RFID (radio frequency identification) tags, photovoltaic, displays, printed antenna and other electronic devices which require conductive elements or components.

Thin-Film Transistors

In yet other embodiments, there is provided a thin film transistor comprising:
 (a) an insulating layer;
 (b) a gate electrode;
 (c) a semiconductor layer;
 (d) a source electrode; and
 (e) a drain electrode,
 wherein the insulating layer, the gate electrode, the semiconductor layer, the source electrode, and the drain electrode are in any sequence as long as the gate electrode and the semiconductor layer both contact the insulating layer, and the source electrode and the drain electrode both contact the semiconductor layer, and wherein at least one of the source electrode, the drain electrode, and the gate electrode are formed by: depositing a liquid composition comprising a metal nanoparticle, a stabilizer, and a solvent onto the substrate to form deposited features, heating the deposited features to a heating temperature during or after the depositing to form an intermediate feature having a central region and an edge region, applying an adhesive substance to at least a portion of a surface of the intermediate feature, and removing the adhesive substance together with at least a portion of the central region of the intermediate feature to form the conductive feature on the substrate.

A gate electrode, a source electrode, and a drain electrode may thus be fabricated by embodiments herein. The thickness of the gate electrode layer ranges for example from about 10 to about 2000 nm. Typical thicknesses of source and drain electrodes are, for example, from about 40 nm to about 1 micrometer with the more specific thickness being about 60 nanometers to about 400 nm.

The insulating layer generally can be an inorganic material film or an organic polymer film. Examples of inorganic materials suitable as the insulating layer may include, for example, silicon oxide, silicon nitride, aluminum oxide, barium titanate, barium zirconium titanate and the like. Illustrative examples of organic polymers for the insulating layer may include, for example, polyesters, polycarbonates, poly(vinyl phenol), polyimides, polystyrene, poly(methacrylate)s, poly(acrylate)s, epoxy resin and the like. The thickness of the insulating layer is, for example from about 10 nm to about 500 nm depending on the dielectric constant of the dielectric material used. An exemplary thickness of the insulating layer is from about 100 nm to about 500 nm. The insulating layer may have a conductivity that is, for example, less than about $10^{-12}$ S/cm.

Situated, for example, between and in contact with the insulating layer and the source/drain electrodes is the semiconductor layer wherein the thickness of the semiconductor layer is generally, for example, about 10 nm to about 1 micrometer, or about 40 to about 100 nm. Any semiconductor material may be used to form this layer. Exemplary semiconductor materials include regioregular polythiophene, oligthiophene, pentacene, and the semiconductor polymers disclosed in U.S. Patent Application Pub. No. 2003/0160230A1; U.S. Patent Application Pub. No. 2003/0160234 A1; U.S. Patent Application Pub. No. 2003/0136958 A1; the disclosures of which are totally incorporated herein by reference. Any suitable technique may be used to form the semiconductor layer. One such method is to apply a vacuum of about $10^{-5}$ torr to $10^{-7}$ torr to a chamber containing a substrate and a source vessel that holds the compound in powdered form, and heat the vessel until the compound sublimes onto the substrate. The semiconductor layer can also generally be fabricated by solution processes such as spin coating, casting, screen-printing, stamping, or jet printing of a solution or dispersion of the semiconductor.

The insulating layer, the gate electrode, the semiconductor layer, the source electrode, and the drain electrode are formed in any sequence, particularly where in embodiments the gate electrode and the semiconductor layer both contact the insulating layer, and the source electrode and the drain electrode both contact the semiconductor layer. The phrase "in any sequence" includes sequential and simultaneous formation. For example, the source electrode and the drain electrode can be formed simultaneously or sequentially. The composition, fabrication, and operation of thin film transistors are described in U.S. Pat. No. 6,107,117, the disclosure of which is totally incorporated herein by reference.

In embodiments, at least one of the gate, source or drain electrode in a thin-film transistor is formed by using a method described herein to form conductive features on a substrate, depositing a liquid composition comprising a metal nanoparticle, a stabilizer, and a solvent onto the substrate to form deposited features, heating the deposited features to a heating temperature during or after the depositing to form an intermediate feature having a central region and an edge region, applying an adhesive substance to at least a portion of a surface of the intermediate feature, and removing the adhesive substance together with at least a portion of the central region of the intermediate feature to form the conductive feature on the substrate.

Embodiments herein are further illustrated by way of the following examples. All percentages and parts are by weight unless otherwise indicated. Room temperature refers to a temperature ranging for example from about 20° C. to about 25° C.

EXAMPLES

Preparation of Hexadecylamine-Stabilized Silver Nanoparticles 144.6 grams of 1-hexadecylamine (600 millimoles, Aldrich, 90%) and 160 ml of toluene were heated to around 65° C. under agitation in a 1 L jacketed reactor under nitrogen blanket. 20 grams of silver acetate (120 mmoles, Alfa Aesar, 99%) was then added to the reactor over 2 minutes; the silver acetate dissolved rapidly. A second portion of hexadecylamine (144.6 grams) was poured into the reactor and the solution was cooled to 55° C. over a period of 45 minutes. 7.13 grams of phenylhydrazine (66 mmoles, Aldrich, 97%) diluted in 10 ml of toluene was added to the reactor over 10 minutes. The solution became a black-red color, indicating the reduction of silver particles and the formation of silver nanoparticles. The solution was mixed for 15 more minutes to ensure completion of the reduction reaction. The reactor was then cooled down to below 50° C. and the product was precipitated by adding 240 ml of isopropanol, followed by 560 ml of methanol, to the reactor. The solution turned a dark purple-blue color. The solution was allowed to mix for 5 minutes, then discharged and transferred over to a vacuum filtration unit with a 3-inch diameter filter fitted with 0.5 µm GORE-TEX membrane. The metallic blue cake was dispersed in 200 ml of isopropanol and washed for 30 minutes to remove any residual amines and byproducts from the reaction. The mixture was filtered using the same filter media. This was followed by three 50 ml methanol rinses to help remove isopropanol from the surface of the particles. The particles were then dried in a vacuum oven overnight at 30-40° C. The final yield of product was 15.21 grams (94.4% theoretical) containing 81% silver (estimated from TGA analysis).

Preparation of Silver Nanoparticle Composition 0.8 grams of hexadecylamine-silver nanoparticles (was dispersed into a 1.2 gram mixture of decalin and dodecylbenzene (decalin 1.1 gram, dodecylbenzene 0.1 gram) to form an ink composition. The ink composition was mixed for 3 hours at a temperature at 38-40° C. and then filtered though a 1 µm syringe filter. The resulting mixture was place on a lab shaker (IKA MS2 Minishaker) for 5 to 10 minutes.

The silver nanoparticle composition was printed on a glass slide using a DIMATIX 2800 Materials Printer equipped with a piezo drop-on-demand ink cartridge to form a thin brown lines of silver nanoparticles. The thin lines of silver nanoparticles were heated in an oven at a temperature of 140° C. for 10 minutes to anneal the silver nanoparticles, and form shiny mirror-like thin lines having a thickness of approximately 140 nm and a width of 80 μm, as measured using a Veeco Dektak 6M Surface Profiler. A piece of SCOTCH tape (manufactured by 3M) was placed directly one top of the thin line and a gentle pressure was applied to the top of the tape to ensure sufficient contact between the thin lines and the tape. The tape was removed slowly from the substrate, such that a central portion of the thin lines were removed, which resulted in conductive lines having a width of about 4-5 μm that are continuous and uniform. The conductivity of the annealed silver lines is estimated to about $10^4$ S/cm, as measured by KEITHLEY 4200-SCS 2 point probe.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A method of forming a high resolution feature on a substrate, the method comprising:
    depositing a liquid composition comprising a substance and a solvent onto the substrate to form a planar deposited feature,
    heating the planar deposited feature to a heating temperature during or after the depositing to form a planar intermediate feature having a central region and an edge region, wherein the solvent of the liquid composition has a boiling point that is 100° C. or more higher than the heating temperature, and wherein the planar intermediate feature comprises a residual amount of the solvent in the central region,
    applying an adhesive substance to at least a portion of the central region of the planar intermediate feature, and
    removing the adhesive substance together with the central region of the planar intermediate feature, leaving the edge region of the planar intermediate feature on the substrate so as to form the high resolution feature on the substrate.

2. The method of claim 1, wherein the substance is metal nanoparticles selected from the group consisting of silver, gold, platinum, palladium, copper, cobalt, zinc, indium, tin, chromium, nickel, silver-copper composite, silver-gold-copper composite, silver-palladium composite, silver-gold-palladium composite and mixtures thereof.

3. The method of claim 2, wherein the metal nanoparticles further comprise a stabilizer having a formula of X—Y,
    wherein X is a hydrocarbon group comprising from about 4 carbon atoms to about 24 carbon atoms, and
    wherein Y is a functional group attached to a surface of the metal nanoparticle and being selected from the group consisting of hydroxyl, amine, carboxylic acid, thiol and its derivatives, xanthic acid, pyridine, pyrrolidone, carbamate and mixtures thereof.

4. The method of claim 3, wherein the metal nanoparticles are silver nanoparticles and the stabilizer is an organoamine stabilizer selected from the group consisting butylamine, pentylamine, hexylamine, heptylamine, octylamine, nonylamine, decylamine, hexadecylamine, undecylamine, dodecylamine, tridecylamine, tetradecylamine, diaminopentane, diaminohexane, diaminoheptane, diaminooctane, diaminononane, diaminodecane, diaminooctane, dipropylamine, dibutylamine, dipentylamine, dihexylamine, diheptylamine, dioctylamine, dinonylamine, didecylamine, methylpropylamine, ethylpropylamine, propylbutylamine, ethylbutylamine, ethylpentylamine, propylpentylamine, butylpentylamine, tributylamine, trihexylamine and mixtures thereof.

5. The method of claim 1, wherein the solvent is selected from the group consisting of dodecylbenzene, decalin, tetrahydronaphthalene, bi-cyclohexane, isoparaffinic hydrocarbons, hexalin, a cyclic terpene, a cyclic terpinene, 1-phenyl-1-cyclohexene, 1-tert-butyl-1-cyclohexene, terpinolene, γ-terpinene, α-terpinene, α-pinene, terpineol, methyl naphthalene and mixtures thereof.

6. The method of claim 1, wherein the depositing is conducted by inkjet printing.

7. The method of claim 1, wherein the planar deposited feature is heated to a temperature of 150° C. or less.

8. The method of claim 1, wherein the planar intermediate feature has a width of at least 30 microns.

9. The method of claim 1, wherein the high resolution feature has a width of less than about 10 microns.

10. The method of claim 1, wherein the liquid composition further includes a second solvent, and wherein the boiling point of the solvent is at least 50° C. higher than a boiling point of the second solvent.

11. The method of claim 1, wherein the adhesive substance is applied to an entire surface of the planar intermediate feature, such that the adhesive substance contacts the central region and the edge region of the planar intermediate feature, but removal of the adhesive substance does not remove the edge region from the substrate.

12. A method of forming a high resolution feature on a substrate, the method comprising:
    depositing a liquid composition comprising metal nanoparticles and a solvent onto the substrate to form a planar deposited feature,
    annealing the planar deposited feature by heating the planar deposited feature to a heating temperature during or after the depositing and thereby forming a planar intermediate feature having a central region and an edge region, wherein the solvent of the liquid composition has a boiling point that is 100° C. or more higher than the heating temperature, and wherein the planar intermediate feature comprises a residual amount of the solvent in the central region,
    applying an adhesive substance to at least a portion of the central region of the planar intermediate feature, and
    removing the adhesive substance together with the central region of the planar intermediate feature, leaving the edge region of the planar intermediate feature on the substrate so as to form the high resolution feature on the substrate.

13. The method of claim 12, wherein the adhesive substance is applied to an entire surface of the planar intermediate feature, such that the adhesive substance contacts the central region and the edge region of the planar intermediate feature, but removal of the adhesive substance does not remove the edge region from the substrate.

14. The method of claim 12, wherein the metal nanoparticles are selected from the group consisting of silver, silver-copper composite, silver-gold-copper composite, silver-palladium composite, silver-gold-palladium composite and mixtures thereof.

15. The method of claim 12, wherein the metal nanoparticles further comprise a stabilizer having a formula of X—Y,
wherein X is a hydrocarbon group comprising from about 4 carbon atoms to about 24 carbon atoms, and
wherein Y is a functional group attached to a surface of the metal nanoparticle and being selected from the group consisting of hydroxyl, amine, carboxylic acid, thiol and its derivatives, xanthic acid, pyridine, pyrrolidone, carbamate and mixtures thereof.

16. The method of claim 15, wherein the metal nanoparticles are silver nanoparticles and the stabilizer is an organoamine stabilizer selected from the group consisting butylamine, pentylamine, hexylamine, heptylamine, octylamine, nonylamine, decylamine, hexadecylamine, undecylamine, dodecylamine, tridecylamine, tetradecylamine, diaminopentane, diaminohexane, diaminoheptane, diaminooctane, diaminononane, diaminodecane, diaminooctane, dipropylamine, dibutylamine, dipentylamine, dihexylamine, diheptylamine, dioctylamine, dinonylamine, didecylamine, methylpropylamine, ethylpropylamine, propylbutylamine, ethylbutylamine, ethylpentylamine, propylpentylamine, butylpentylamine, tributylamine, trihexylamine and mixtures thereof.

17. The method of claim 12, wherein the solvent is selected from the group consisting of dodecylbenzene, decalin, tetrahydronaphthalene, bi-cyclohexane, isoparaffinic hydrocarbons, hexalin, a cyclic terpene, a cyclic terpinene, 1-phenyl-1-cyclohexene, 1-tert-butyl-1-cyclohexene, terpinolene, γ-terpinene, α-terpinene, α-pinene, terpineol, methyl naphthalene and mixtures thereof.

* * * * *